United States Patent
Eloy

[11] Patent Number: 5,993,550
[45] Date of Patent: Nov. 30, 1999

[54] PHOTOIONIC MICROHEAD DEVICE FOR THE TREATMENT OF A MATERIAL SURFACE BY POWDER DEPOSITION

[75] Inventor: Jean François Albert Eloy, Gradignan, France

[73] Assignee: Commissariat A l'Energie Atomique, Paris, France

[21] Appl. No.: 08/913,614

[22] Filed: Sep. 22, 1997

[30] Foreign Application Priority Data

Mar. 21, 1995 [FR] France ..................... 95 03275

[51] Int. Cl.⁶ .................. B05B 7/00; B23K 26/00
[52] U.S. Cl. .................. 118/308; 219/121.84
[58] Field of Search .................. 118/308, 312, 118/600, 612, 621, 629, 623; 219/121.84, 121.83, 121.6; 606/15, 16

[56] References Cited

U.S. PATENT DOCUMENTS

| | | | |
|---|---|---|---|
| 5,486,676 | 1/1996 | Aleshin | 219/121.84 |
| 5,760,362 | 6/1998 | Eloy | 219/121.84 |

Primary Examiner—Richard Crispino
Assistant Examiner—Calvin Padgett
Attorney, Agent, or Firm—Oblon, Spivak, McClelland, Maier & Neustadt, P.C.

[57] ABSTRACT

The invention relates to a device for the treatment for the surface of a material by depositing a material in powder form comprising:

- at least one optical fibre (2),
- a light source (4) able to produce a pulsed light,
- means (6) for injecting light into a first end of the optical fibre,
- a miniaturized photoionic head (8) fixed to a second end of the optical fibre and ensuring the diffusion of the light propagated by the optical fibre towards the material to be deposited and
- a powder reservoir (28a) and a gas reservoir (28b), which are concentric and positioned around the optical fibre and issuing into a dispersion chamber (26) and
- a confinement ring (16) having two nozzles positioned between the photoionic head and the material to be treated in order to ensure the ionization of the dispersed powder.

20 Claims, 2 Drawing Sheets

PHOTOIONIC MICROHEAD DEVICE FOR THE TREATMENT OF A MATERIAL SURFACE BY POWDER DEPOSITION

This is a 371 of PCT/FR96/00417, filed Mar. 20, 1996.

TECHNICAL FIELD

The invention relates to a device for treating the surface of a material by adding a substance in powder form.

This device, which is constituted by a photoionic microhead probe, has numerous applications. The invention can in particular be applied to the field of microelectronics for the localized deposition of specific coatings, the restoration or destruction of functions of components of a microcircuit or the production of novel alloy types for electrical connections. It can also apply to the micromechanical field for the localized deposit of refractory compounds improving the resistance to corrosion, abrasion or by hardening reducing friction. The invention also has applications in the cleaning and restoration of ancient and art objects requiring the microlocation of the intervention or for localized automatic treatments in hostile environments.

In particular, the invention has applications in the dental sector and particularly that of dental surgery, for the localized painless preparations and treatments of teeth or for the adaptation of prostheses in order to restore tissues and improve the resistance to caries.

PRIOR ART

It is known that the composition of a surface of a material can be modified by adding a substance to said surface.

FR-A-2 709 763 describes a device for the treatment of a material using a miniaturized photoionic head having a coating of the substance to be deposited. FIG. 1 diagrammatically shows this device for the treatment of a material having an optical fibre 2, a power laser 4 able to emit a pulsed laser beam, means 6 for injecting the laser beam into one of the two ends of the optical fibre 2 and a miniaturized photoionic head 8 permitting the treatment of the surface of the material 10, said head 8 being installed on the second end of the optical fibre. This device also has means 11 for establishing potential differences within the device.

According to an embodiment of said device, the latter also has another laser 7a able to continuously emit visible light permitting the observation of the area to be treated, an optical means 7b ensuring the coupling and injection of the observation laser beam and observation means 7c (such as a video screen) to permit the display of the area of the material to be treated.

FIG. 2 shows in greater detail the photoionic head 8 of said device. FIG. 2 shows that the optical fibre 2 comprises an electrically conductive sheath 12 (e.g. a braided metal sheath) surrounding the cladding of the fibre 2 over the entire length of the latter, as well as another electrically insulating sheath 14 surrounding the sheath 12 and which serves as a protective sheath.

The head 8 also has an electrically insulating ring or collar 16, whose external diameter is substantially equal to the external diameter of the optical fibre 2 and which is placed on one side against the planar face of the end of said optical fibre 2, whereas the other side of the ring 16 is placed against the material 10 to be treated. More specifically, the head 8 is positioned in such a way that the ring 16 surrounds the material area 18 to be treated.

The head 8 also has a thin film 20 made from the substance to be projected onto the area 18. This thin film 20 is placed in the space defined by the ring 16, against the planar face of the end of the optical fibre 2 and is consequently remote from the area 18 to be treated.

FIG. 2 also shows an intermediate coating 22 making it possible to reduce the optical index jump between the material constituting the optical fibre 2 and the material constituting the thin film 20.

Polarizing means 11 supply a polarization to the material 10 so as to create, in the ring 16, an electric field able to accelerate ions formed from the thin film 20 in order to implant said ions in the area 18 of the material 10.

More specifically, the implantation of ions in said area 18 takes place in the following way:

the laser 4 is switched and then emits a power light pulse, which is injected into the optical fibre 2 where it is propagated up to the photoionic head 8, said power pulse reaches the thin film 20 and brings about the explosive evaporation thereof, a plasma then forms in the space 19 defined by the ring 16 and positive ions of said plasma are accelerated in the direction of the area 18 as a result of the electric field established in the aforementioned manner, the ions then being implanted in said area 18, whilst the electrons of the plasma are accelerated in the opposite direction towards the optical fibre 2.

Therefore the ring 16 confines the plasma and explosive wave (or shock wave) produced during the formation thereof.

Therefore this device suffers from the disadvantage of being unusable with a substance or material in powder form. Thus, the substance is introduced into the device in the form of a thin film 20, which is produced by a vacuum deposition process.

Moreover, as the photoionic head includes the thin film of substance to be deposited, it can only be reused following a reloading operation, i.e. a substance redeposition in order to form another thin film on the exit face of the optical fibre, so that a relatively long handling time is involved.

In order to project a powder chemical compound onto the surface of a material, the expert can use a powder projection or blasting system as described in Clauer A. H., Fairand B. P., Application of lasers in material processing, Metzbower E. A. edit. American Society for Metals, Metal Park, Ohio, 1979.

This projection system uses a chemically active or inactive or compressed air nozzle. With said nozzle can be associated gas combustion means so that the compound is projected in the form of a plasma, so as to bring about the melting or fusion of the powder before it reaches the surface to be treated. In the process used with this system, the formation of a surface alloy coating formed by the projection of a powder requires a continuous gas combustion. However, this projection in plasma form takes place at high temperatures, which makes the system unusable on certain materials, particularly biological tissues unable to withstand a high thermal gradient.

In addition, no matter what the process used for treating the surface of a material by adding a substance in powder form, it is generally necessary to prepare said surface. However, said preparation is difficult to carry out, particularly when the substance is a pulverulent powder unsuitable for compaction.

DESCRIPTION OF THE INVENTION

The object of the invention is to obviate the disadvantages of the above-described, known devices. It therefore proposes a photoionic microhead device permitting the performance of treatments on the surface of a material by adding a substance in powder form.

More specifically, the invention relates to a device for the treatment of a material by depositing a substance comprising:

at least one optical fibre, a light source able to produce a pulsed light, means for injecting the light into a first end of the optical fibre, a miniaturized photoionic head fixed to the second end of the optical fibre and ensuring the diffusion of the wave transmitted by the optical fibre and a confinement ring placed between the photoionic head and the material to be treated.

This device also has an envelope surrounding the photoionic head, as well as at least part of the optical fibre and forming a dispersion chamber into which is introduced the substance to be deposited on the material.

As the substance is a powder, the envelope has two concentric reservoirs, whereof one is able to contain the powder and the other the gas. These reservoirs have an opening issuing into the chamber, so that the powder and gas can be introduced into the chamber.

Advantageously, the device according to the invention has a system of fins positioned level with the opening of the tanks towards the chamber in order to ensure a dispersion of the powder in the gas and create a dispersed powder.

According to the invention, the photoionic head comprises a diffuser oriented towards the material to be treated and which on the one hand ensures the diffusion of the wave propagated by the optical fibre in the dispersed powder so as to create a shock wave and on the other the extraction of the dispersed powder from the device.

Advantageously, the confinement ring has a main nozzle centrally perforated and fixed to the envelope in order to ensure the propagation of the shock wave and a secondary nozzle perforated in its centre and placed within the main nozzle in order to return to the diffuser the dispersed powder coming from the chamber.

The optical fibre is covered with an electrically conductive sheath and the main nozzle is covered on its inner wall with a layer of electrically conductive material, so as to ensure a potential difference between said nozzle and the sheath of the optical fibre.

According to an embodiment of the invention, the device has heating means located in the powder reservoir in order to preheat said powder.

According to a preferred embodiment of the invention, the photoionic head incorporates a laser microchip placed between the second end of the optical fibre and the diffuser.

DETAILED DESCRIPTION OF EMBODIMENTS OF THE INVENTION

Figure 2:
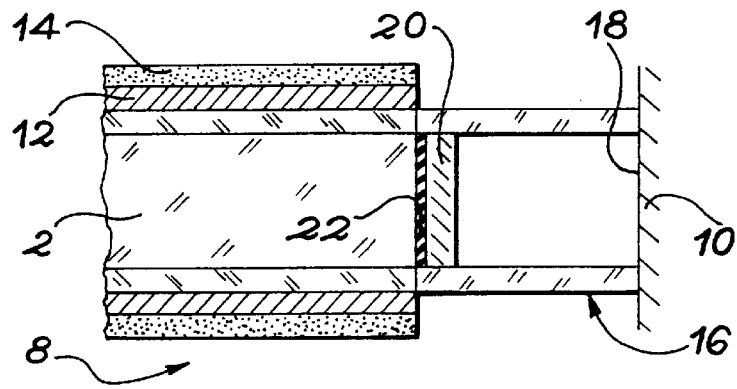
FIG. 2, already described, diagrammatically shows the miniaturized photoionic head of the prior art device.
Figure 3:
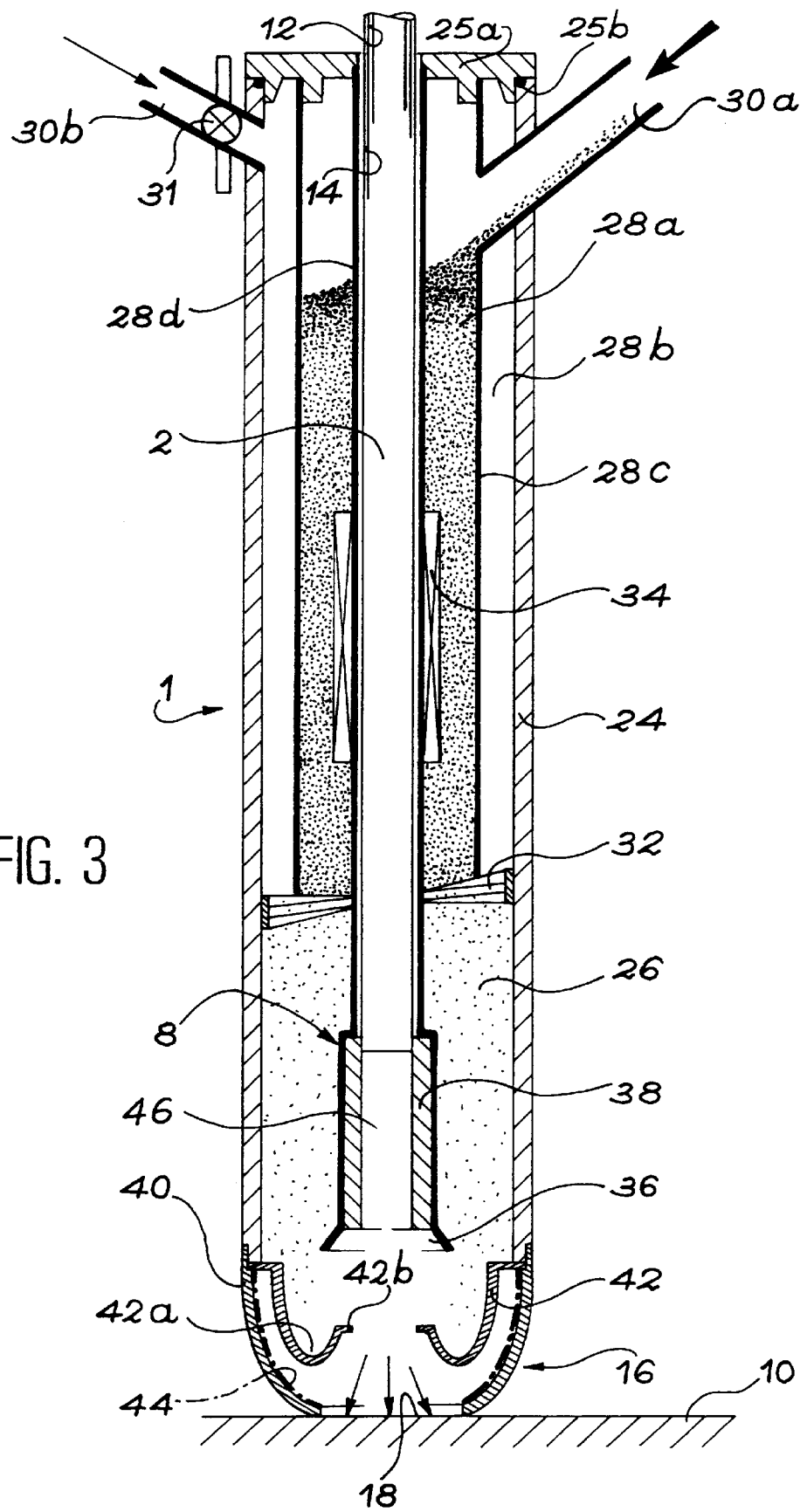
FIG. 3 diagrammatically shows the powder projection probe according to the invention.

FIG. 3 shows the photoionic microhead probe according to the invention. In FIG. 3, as well as FIG. 4 which will be described hereinafter, the elements of the device according to the invention identical to those of the prior art device shown in FIGS. 1 and 2, will carry the same references.

Figure 1:
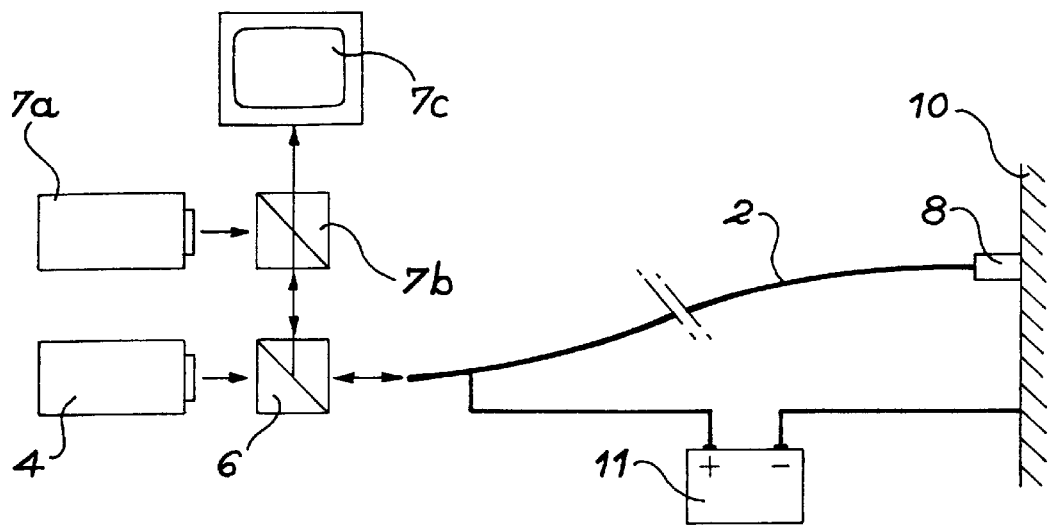
FIG. 1, already described, diagrammatically shows the prior art device.
Figure 4:
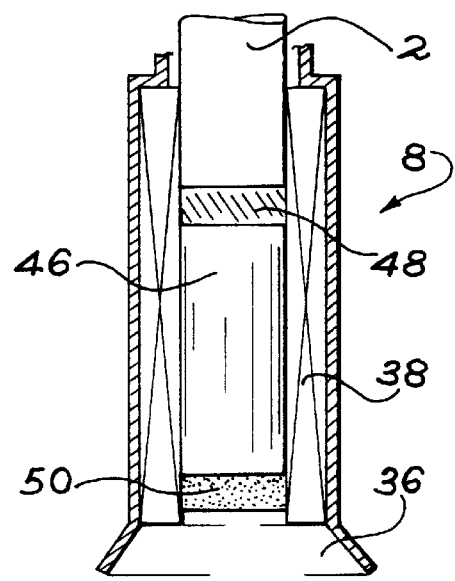
FIG. 4 shows an embodiment of the photoionic microhead according to the invention.

In addition, for simplification reasons, FIGS. 3 and 4 do not show the means of the device other than the probe (e.g. the pulsed laser 4, the means for introducing laser beams into the optical fibre 2, the polarizing means 11, etc.), because said means are shown in FIG. 1 and are identical for the prior art device and the device according to the invention.

FIG. 3 consequently shows the photoionic microhead probe according to the invention. This probe 1 has an optical fibre 2 surrounded by a first, electrically conductive sheath 12 and a second, insulating material sheath 14. As in the device of FIG. 1, said optical fibre 2 is connected by one of its ends to the means for introducing the pulsed laser beam into said optical fibre 2 and on its second end is installed the miniaturized photoionic head 8. The function of the microhead 8 is to propagate the power pulse from the laser up to the substance to be deposited (powder) and diffuse said pulse so as to ionize the substance which it is wished to deposit on the area 18 of the material 10. The ring or collar 16 ensuring the confinement of said substance is placed between the microhead 8 and the material 10. Said ring 16 is able to confine a plasma liable to form as a result of the pulsed light in the space defined by said ring as from the powder located therein. The ring 16 will be described in greater detail hereinafter.

The microhead 8 and part of the fibre 2 are surrounded by an envelope 24 forming, in part of the envelope, a dispersion chamber 26.

Within said envelope 24 is also formed a double reservoir 28a/28b. More specifically, this double reservoir is produced from a second wall 28d surrounding the optical fibre 2 and a second wall 28c concentric to the first wall 28d and the envelope 24. The second wall 28c forms, between the first wall 28d and itself, a powder reservoir and between itself and the envelope 24, a gas reservoir 28b. This gas can be an inert gas such as nitrogen or oxygen, or a light gas of the helium type.

A pipe 30b issues into the gas reservoir 28b so as to permit the introduction of gas into it. The pipe 30b is also provided with a trigger 31 permitting the opening or closing of the pipe, which permits a non-continuous introduction of the gas into the probe 1. In the same way, a pipe 30a issues into the reservoir 28a and permits the introduction of powder into it.

The pipe for introducing powder into the powder reservoir 28a can also have a trigger, not shown in the drawing for simplification reasons, but which is substantially identical to the trigger 31 of the gas introduction pipe 30b. As for the gas trigger, said trigger would make it possible to control the introduction of the powder and in particular the powder quantity introduced.

The powder 28a and gas 28b reservoirs are sealed at one of their ends by a cover 25a provided with an O-ring 25b. The other end of said reservoirs 28a and 28b issues into the dispersion chamber 26. At said end, a system of fins 32 ensures the dispersion of the powder from the powder reservoir 28a and entrained by the flow of injection gas from reservoir 28b. The powder then introduced into the dispersion chamber is mixed with the gas and is referred to as the "dispersed powder". Beforehand, it is possible to preheat the powder when located in its reservoir 28 by the Joule effect or by microwaves using a sleeve 34 placed in the powder reservoir 28a around the optical fibre 2. The function of said sleeve is to raise the powder compound to a temperature between 30 and 80° C., as a function of needs, which makes it possible to dry or dehydrate said powder compound or increase, if necessary, its chemical activity at the time of deposition.

The photoionic microhead 8 has a diffuser 36, as well as a head support permitting the holding of the assembly of the microhead and the optical fibre 2. The function of the diffuser 36 is to diffuse the power pulse transmitted by the optical fibre into the dispersed powder, whilst also ensuring powder discharge from the probe 1.

The confinement ring 16 is fitted on the envelope 24, at the end of the microhead 8. More specifically, said confinement ring 16 is fitted in a detachable manner to the envelope 24. It can e.g. form a screw/nut system with the end of said envelope 24.

Said confinement ring 16 incorporates a main nozzle 40 and a secondary nozzle 42. The secondary nozzle 42 is of the baffle nozzle type, i.e. it is centrally perforated and has minute holes for channelling the dispersed powder. Said secondary nozzle is also inwardly curved, so as to form a cylindrical cup 42a with a central ledge or flange 42b. The specific shape of said nozzle 42 has the effect of returning the dispersed powder mist from the dispersion chamber 26 in the form of power multijets to the diffuser 36, i.e. to the location from which has passed the power pulse (i.e. the shock wave).

The main nozzle 40 is also centrally perforated so as to permit the discharge of the powder to be projected from the probe towards the area 18 of the material to be treated. Thus, the laser radiation transmitted by the optical fibre 2 leaves the photoionic microhead 8 in the form of a shock wave, which induces a volatilization process by thermal shock of the powder located in the vicinity of the outlet of the microhead 8, i.e. the diffuser 36. This powder, which is called "volatilized powder" is then sent by the diffuser and nozzles 40 and 42 towards the outlet of the probe 1, i.e. towards the material 10. The laser radiation inducing the thermal shock-based volatilization process makes it possible on the one hand to localize the energy deposition at the outlet of the optical device, i.e. the microhead 8 and makes it possible on the other hand to limit the temperature rise to that of the projected substance. Thus, this process does not lead to the dissipation of heat exceeding the temperature supplied by the sleeve 34 to the powder.

The main nozzle 40 ensures a confinement of the volatilized powder, so that the shock wave from the microhead 8 can propagate to the exit of the probe 1, i.e. to the material 10. Said nozzle 40 is also covered on its inner wall with an electrically conductive material coating 44. This coating 44 can be raised to a certain electrical potential, e.g. by the polarizing means 11 shown in FIG. 1. Preferably, said coating is raised to a reference potential, such as the electrical potential of earth, which enables the creation between the sheath 12 of the optical fibre 2 and said main nozzle 40 of a certain electrical field. This electrical field ensures the acceleration of the ions formed from the shock wave and the dispersed powder, so as to implant said ions in the area 18 of the material 10 to be treated. Thus, the only difference between the prior art device of FIG. 1 and the device according to the invention, from the standpoint of connections, is in the fact that the polarizing means 11 are connected, not to the material 10 as in the prior art, but to the coating 44 of the main nozzle 40.

The main nozzle 40 also has the function of permitting the deflection of part of the gas jet arriving peripherally to the powder-charged gas jet, so as on the one hand to facilitate the reversal of the direction by 180° of the powder jet and on the other engage the powder on the diffuser 36.

According to the preferred embodiment of the invention, the laser emits pulsed, i.e. discontinuous beams, which makes it possible to discontinuously project the powder, whilst still having a continuous introduction of powder into the dispersion chamber. This phenomenon leads to a significant reduction of the handling time, particularly when it is necessary to deposit significant thicknesses on the surface of the materials.

More specifically, the laser beam transmitted by the optical fibre 2 in order to be introduced into the microhead 8 is pulsed at a high speed, so as to successively permit at regular intervals the deposition of a fine powder layer by powder jet injected by the gas and pulverulized by the fin system 32 on the diffuser 36 and the volatilization of said fine powder layer in order to implant it on the surface of the material to be treated.

FIG. 4 shows in greater detail the preferred embodiment of the photoionic microhead. FIG. 4 shows, in the same way as in FIG. 3, the optical fibre 2 terminating in the microhead 8. As in FIG. 3, the microhead 8 has the diffuser 36 and head support 38. It also has a microchip 46, which can e.g. be a laser microchip. The function of the microchip 46 is to ensure the transformation of the low level flux from the optical fibre into a high level flux necessary for producing a shock wave. The microchip 46 permits the use for the device of an ordinary optical fibre, i.e. it is inexpensive, which has the advantage of making the assembly of the head inexpensive, particularly for applications in dental surgery where, for such an application, it is necessary to have a relatively inexpensive and use-flexible technology.

Obviously said microchip 46 is not necessary for the operation of the device (cf. the embodiment of FIG. 3). In this case, it is possible to use an optical fibre, but the latter must be of a type suitable for the envisaged application and consequently has a relatively high cost.

In the embodiment of FIG. 4, deposition has also taken place of an antireflection coating 48 between the exit face of the optical fibre 2 and the microchip 46 in order to permit a better adaptation of the light fluxes from the optical fibre and thus improve the function of the laser. Thus, as a result of the antireflection coating the light fluxes are not reflected on the input of the microchip 46.

According to this preferred embodiment of the invention, the microhead 8 also has a coating of a saturable absorbant material permitting the optical switching of the laser cavity in order to reach the high supplied laser flux densities necessary for creating the shock effect and for powder volatilization.

When there is no gas injection or powder supply, the microhead 8 permits the performance of functions other than those described hereinbefore. It e.g. permits a prior preparation of the surface of the material 10, e.g. by using a cleaning process by laser desorption or laser photoablation or direct thermal shock induced by the laser impacting on the surface of the material 10.

The probe 1 described hereinbefore has the advantage of easy handling. It therefore permits the carrying out on a large variety of surfaces of small and often difficultly accessible objects, of microlocalized treatments, such as bacterial disinfection, plates, sealing of channels, cracks or cavities, surface hardening and vitrification and in particular the production of amalgams and novel alloys.

I claim:

1. Device for the treatment of a material by depositing a powder comprising:

at least one optical fibre, a light source able to produce a pulsed light, means for injecting light into a first end of the optical fibre, a miniaturized photoionic head fixed to a second end of the optical fibre and ensuring the diffusion of light propagated by the optical fibre towards the substance to be deposited and a confinement ring located between the photoionic head and the material to be treated, characterized in that the device also has an envelope surrounding the photoionic head and at least part of the optical fibre and forming a dispersion chamber in which is located the powder to be deposited on the material.

2. Device according to claim 1, characterized in that the envelope has two concentric reservoirs, one being for the powder and the other for a gas.

3. Device according to claim 2, characterized in that the device has heating means located in the powder reservoir in order to preheat said powder.

4. Device according to claim 2, characterized in that the photoionic head has a microchip placed between the second end of the optical fibre and the diffuser.

5. Device according to claim 2, characterized in that the photoionic head incorporates a diffuser oriented towards the material to be treated and ensuring both the diffusion of light into the dispersed powder so as to create a shock wave and the extraction of the dispersed powder from the device.

6. Device according to claim 2, characterized in that each of the reservoirs has an opening issuing into the dispersion chamber and the powder and gas can then be introduced into said chamber.

7. Device according to claim 6, characterized in that the photoionic head incorporates a diffuser oriented towards the material to be treated and ensuring both the diffusion of light into the dispersed powder so as to create a shock wave and the extraction of the dispersed powder from the device.

8. Device according to claim 6, characterized in that the device has heating means located in the powder reservoir in order to preheat said powder.

9. Device according to claim 6, characterized in that the photoionic head has a microchip placed between the second end of the optical fibre and the diffuser.

10. Device according to claim 6, characterized in that the device has a fin system level with the opening of the reservoirs towards the dispersion chamber in order to ensure a dispersion of the powder in the gas and obtain a dispersed powder.

11. Device according to claim 10, characterized in that the photoionic head incorporates a diffuser oriented towards the material to be treated and ensuring both the diffusion of light into the dispersed powder so as to create a shock wave and the extraction of the dispersed powder from the device.

12. Device according to claim 10, characterized in that the has heating means located in the powder reservoir in order to preheat said powder.

13. Device according to claim 10, characterized in that the photoionic head has a microchip placed between the second end of the optical fibre and the diffuser.

14. Device according to claim 10, characterized in that the photoionic head incorporates a diffuser oriented towards the material to be treated and ensuring both the diffusion of light into the dispersed powder so as to create a shock wave and the extraction of the dispersed powder from the device.

15. Device according to claim 14, characterized in that the device has heating means located in the powder reservoir in order to preheat said powder.

16. Device according to claim 14, characterized in that the photo ionic head has a microchip placed between the second end of the optical fibre and the diffuser.

17. Device according to claim 14, characterized in that the confinement ring has a centrally perforated main nozzle fixed to the envelope so as to ensure the propagation of the shock wave and a centrally perforated secondary nozzle placed within the main nozzle in order to return to the diffuser the dispersed powder from the chamber.

18. Device according to claim 17, in which the optical fibre is covered with an electrically conductive sheath, characterized in that the main nozzle is covered, on its inner wall, with an electrically conductive material coating ensuring a potential difference between said main nozzle and the optical fibre sheath.

19. Device according to claim 17, characterized in that the device has heating means located in the powder reservoir in order to preheat said powder.

20. Device according to claim 17, characterized in that the photoionic head has a microchip placed between the second end of the optical fibre and the diffuser.

* * * * *